United States Patent
Lingunis et al.

(10) Patent No.: US 6,933,219 B1
(45) Date of Patent: Aug. 23, 2005

(54) TIGHTLY SPACED GATE FORMATION THROUGH DAMASCENE PROCESS

(75) Inventors: Emmanuil H. Lingunis, San Jose, CA (US); Krishnashree Achuthan, San Ramon, CA (US); Minh Van Ngo, Fremont, CA (US); Cyrus Tabery, Sunnyvale, CA (US); Jean Y. Yang, Sunnyvale, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 10/716,209

(22) Filed: Nov. 18, 2003

(51) Int. Cl.$^7$ .................. H01L 21/3205; H01L 21/4763
(52) U.S. Cl. ..................... 438/593; 438/257; 438/637
(58) Field of Search ........................... 438/151, 157, 438/176, 257, 259, 591, 593, 636, 637, 647, 438/648, 650, 674

(56) References Cited

U.S. PATENT DOCUMENTS

| | | | |
|---|---|---|---|
| 6,461,529 B1 * | 10/2002 | Boyd et al. ................ | 216/67 |
| 6,469,343 B1 * | 10/2002 | Miura et al. ............... | 257/324 |
| 6,563,160 B2 * | 5/2003 | Clevenger et al. .......... | 257/301 |
| 6,686,231 B1 | 2/2004 | Ahmed et al. .............. | 438/164 |
| 6,723,657 B2 * | 4/2004 | Sitaram ...................... | 438/745 |
| 6,737,670 B2 * | 5/2004 | Cheng et al. ................ | 257/19 |
| 2003/0109111 A1 * | 6/2003 | Hsieh et al. ................ | 438/400 |

OTHER PUBLICATIONS

"Shipley Announces New Dual Purpose Spin—On Anti-Reflection Coating for Device Fabrication." New Release from www.rohmhass.com, May 2002.*

Huang et al., "Very Low Defects and High Performance Ge—On—Insulator p—MOSFETs with Al2O3 Gate Dielectrics", 2003 Symposium on VLSI Technology Digest of technical papers, p 119-120 (Jun. 10-12, 2003).*

* cited by examiner

Primary Examiner—Asok Kumar Sarkar
(74) Attorney, Agent, or Firm—Renner, Otto, Boisselle & Sklar, LLP (57) ABSTRACT

The invention includes an apparatus and a method of manufacturing such apparatus using a damascene process. The method includes the step of patterning a layer disposed over a substrate to include a line and space pattern. The line and space pattern in the layer includes at least one space comprising a width dimension of a feature to be formed. The feature may be, e.g., a wordline(s)/gate electrode(s). Additionally, the sidewalls of the feature, e.g., the wordline(s)/gate electrode(s) include relatively smooth surfaces.

12 Claims, 3 Drawing Sheets

TIGHTLY SPACED GATE FORMATION THROUGH DAMASCENE PROCESS

TECHNICAL FIELD

The present invention generally relates to the manufacture of semiconductor devices and, more specifically, relates to the manufacture of semiconductor devices including tightly spaced gate formations through a damascene process.

BACKGROUND ART

Semiconductor device manufactures produce various semiconductor devices, e.g., a field effect transistor, a floating gate FLASH memory cell, a SONOS (Silicon/Oxide/Nitride/Oxide/Silicon) type FLASH memory device or the like, on semiconductor substrates. The manufactures of such devices continue to scale the devices in order to increase the number of devices formed on a chip that forms an integrated circuit. Given the continuing trend towards miniaturization and increased integration of devices on an integrated circuit chip, the capability to manufacture the substructures precisely and with high quality is of increasing importance.

A vertical stack of non-conductive material and conductive material formed sequentially over a semiconductor substrate characterizes field effect transistors. Specifically, the vertical stack includes a gate electrode formed over a gate dielectric. The gate electrode defines a channel within a doped region interposed between a source and a drain formed in the semiconductor substrate.

Subsequently, floating gate FLASH memory types of EEPROMs (electrically erasable programmable read-only memory) were produced. EEPROMs employ a FLASH memory cell formed over a semiconductor substrate. The FLASH memory cell is characterized by a vertical stack of a tunnel oxide, a first polysilicon layer (charge trapping conducting layer, i.e., a floating gate) over the tunnel oxide, an ONO (oxide-nitride-oxide) intergate dielectric over the first polysilicon layer, and a second polysilicon layer (i.e., a control gate) over the ONO intergate dielectric. The floating gate defines a channel within a doped region interposed between two bitlines formed in the semiconductor substrate. The bitlines, as described above, are doped regions that may act as either a source or a drain.

More recently, SONOS (Silicon/Oxide/Nitride/Oxide/Silicon) type FLASH memory devices have been produced. The SONOS type FLASH memory cells are also characterized by a vertical stack formed over a semiconductor substrate. The SONOS vertical stack includes a charge trapping non-conducting dielectric layer, typically a silicon nitride layer, sandwiched between two silicon dioxide layers (insulating layers), i.e., a lower silicon dioxide layer and an upper silicon dioxide layer.

The charge trapping non-conducting dielectric layer functions as an electrical charge trapping medium. The charge trapping non-conducting dielectric layer may have two separated and separately chargeable areas, i.e., a left bit and a right bit. Each area defines one bit.

A conducting gate layer, i.e., a control gate, is formed over the upper silicon dioxide layer. The SONOS type FLASH memory cell has a lightly doped region (the channel) between two bitlines, i.e., a left bitline and a right bitline (it should be understood by those having ordinary skill in the art that the terms source and drain could be used interchangeably with the term bitlines in this context). The left bitline or the right bitline may act as either a source or a drain. An electrical charge may be trapped locally, i.e., in either the left bit or the right bit, near whichever bitline is used as a drain.

The devices are formed using known semiconductor processing techniques to deposit one or more layers of dielectric material and conductive material sequentially based on the device to be made. Next, the one or more layers are patterned and etched to form the gate stacks described above. The etching process is typically multiple etching steps. An etchant species is selected for a particular etch step that is selective between the material to be etched and the material which is to remain relatively unetched.

For illustrative purposes, the process for forming an EEPROM memory cell is described as follows: forming an ONO dielectric over a semiconductor substrate, depositing polysilicon over the ONO dielectric, and patterning and etching the polysilicon to form gate electrodes or wordlines.

The patterning and etching of the polysilicon is usually accomplished by depositing and patterning a photosensitive layer over the polysilicon to form a lithographic image in the photosensitive layer, i.e., a photosensitive mask. Next, portions of polysilicon exposed by apertures in the photosensitive mask are etched/removed. Then, the photosensitive mask is removed to expose the patterned polysilicon. Thus, polysilicon wordlines/gate electrodes are formed over the ONO dielectric.

Unfortunately, as manufacturers scale down the device dimensions to increase the performance and reduce the cost of manufacture, the scaling down of devices has led to the development of several undesirable results during the processing of the semiconductor devices. For example, as the dimensions of the gate electrodes are reduced, the ability to produce gate electrodes with precise dimensions is limited. That is, the dimensions of gate electrodes produced by an etch process may vary significantly due to many variables, e.g., the etchant species used, the quality of the photosensitive mask produced, variations in the thickness of the photosensitive mask or a combination thereof. Additionally, the etch processes used to etch the polysilicon layer used in the formation of the wordlines, e.g., gate electrodes, produces gate electrodes with vertical sidewalls with relatively rough surfaces. These rough surfaces do not allow good interfaces to be formed between the gate electrodes and subsequent layers formed over the gate electrodes. Thus, the operation of the device may be significantly degraded.

Therefore, there exists a strong need in the art for a method which produces precise wordlines/gate electrodes. Further, there is a need to produce the precise wordlines/gate electrodes in a space of a mask including a line and space pattern that has wordlines/gate electrodes dimensions and/or pitch dimensions for the device(s) to be formed. Further, there is a need for the wordlines/gate electrodes to be formed with sidewalls including a relatively smooth surface. Additionally, there is a need for the mask to be made of material other than photosensitive material. Such an invention would allow the further scaling of semiconductor devices and increase performance.

DISCLOSURE OF INVENTION

One solution is to deposit a conductive material into the openings of a hard mask. The deposited conductive material will become a gate electrode of a semiconductive device. For example, a lithographic image is transferred from a photoresist to a hard mask. Then, polysilicon is deposited in the apertures of the hard mask to form gate electrodes with precise dimensions and smooth vertical surfaces. That is, it is easier to transfer a lithographic image from a patterned photoresist to produce a hard mask including apertures with precise dimensions and smooth sidewalls. The resulting hard mask can then be used to form gate electrodes of polysilicon with precise dimensions and smooth sidewalls. The smooth sidewalls allow high quality interfaces to be formed between the gate electrodes and subsequent layers. Thus, the operation of the device will be improved through this technique.

According to one aspect of the invention, a method of forming a semiconductor device is provided, the method comprising the steps of: forming a dielectric layer over a substrate; forming a mask layer over the dielectric layer; patterning the mask layer to form a mask including a mask line and space pattern, the mask line and space pattern including at least one mask space; and forming a conductive layer in the at least one mask space, the conductive layer including a width dimension about equal to the width dimension of the least one mask space.

According to another aspect of the invention, a method for forming a semiconductor device is provided, the method comprising the steps of: forming a mask over a substrate to include a line and space pattern, the line and space pattern having at least one space including a width dimension; and forming a conductive layer in the at least one space of the mask, the conductive layer includes a width dimension about equal to the width dimension of the at least one space of the mask.

According to another aspect of the invention, a semiconductor device is provided, comprising: a substrate; a dielectric layer disposed over the substrate; and a conductive layer disposed over the dielectric layer, wherein the conductive layer comprises a line and space pattern and wherein sidewalls of the conductive layer include relatively smooth surfaces.

BRIEF DESCRIPTION OF DRAWINGS

These and further features of the present invention will be apparent with reference to the following description and drawings, wherein.

To illustrate the present invention in a clear and concise manner, the drawings may not necessarily be to scale and certain features may be shown in a partial schematic format. Additionally, in the detailed description that follows, identical components have been given the same reference numerals. Further, similar components in different embodiments will have a similar reference numeral incremented by 100. For example, in a first embodiment, a dielectric layer is assigned reference number 18. A subsequent embodiment may use the reference number 118 for the dielectric layer, although the dielectric layer may have a different configuration or different function in the different embodiments. For the sake of brevity, in-depth descriptions of similar components may be omitted from descriptions of the subsequent embodiments.

MODE(S) FOR CARRYING OUT THE INVENTION

The present invention is a semiconductor device or the like including a wordline(s)/gate electrode(s) having smooth sidewalls and critical dimensions tightly controlled by a damascene processes.

In one embodiment, the semiconductor device includes a vertical stack formed over a substrate. The vertical stack includes a dielectric layer and a conductive layer. The dielectric layer is formed over the substrate. A conductive layer is formed over the dielectric layer. A damascene processes is used to form a wordline(s) including a gate electrode(s) from the conductive layer. The damascene processes used in the formation of the wordline(s)/gate electrode(s) tightly controls the critical dimensions of the wordline(s)/gate electrode(s). Additionally, the wordline(s)/gate electrode(s) includes smooth sidewalls. In another embodiment, the dielectric layer of the previously described embodiment may be a charge-trapping dielectric layer. In another embodiment, gate electrodes formed from the conductive layer are within a pitch dimension defined by a resolution limit of lithography.

Additionally, the invention provides a method of producing a hard mask over an intermediate structure of the semiconductor device according to a damascene process. The hard mask includes a line and space pattern. The line and space pattern includes width dimensions and/or pitch dimensions, i.e. critical dimensions, in accordance with the semiconductor device to be achieved.

Further, the invention provides a method of producing or forming a wordline(s)/gate electrode(s) including a width dimension of a space (also referred to herein as an opening, an aperture or the like) formed in a lithographic image in a photoresistive layer used to obtain the lithographic image. After the lithographic image has been transferred to a hard mask, a conductive material is deposited in the opening(s) in the hard mask and over an exposed horizontal surface of the hard mask to form a conductive layer. Next, the conductive layer is planarized to about a thickness of the hard mask thereby forming the wordline(s)/gate electrode(s) in the opening(s) of the hard mask. Then, the hard mask optionally may be selectively removed leaving the wordline(s)/gate electrode(s). In an embodiment, the hard mask is removed and replaced with another insulator, i.e., another dielectric material. The wordline(s)/gate electrode(s) has a width dimension, i.e., a critical dimension, of the space(s) of the hard mask that is about the width dimension of the space(s) of the lithographic image. Additionally, the gate electrode(s) thereby formed includes vertical sidewalls with smooth surfaces. Hence, the dimensions and sidewall profiles are easier to control, e.g., footings produced by a conventional etch process may be reduced or eliminated.

Starting with a substrate (e.g., semiconductor, insulator or metal), a dielectric layer is formed over the substrate. Next, a liner layer is formed over the dielectric layer. The formation of the liner layer is optional. Next, a mask layer of, for example, an insulator material, such as silicon dioxide, is formed over the dielectric layer. Next, an anti-reflective coating (ARC) is formed over the mask layer. The formation of the ARC is optional. The mask layer alone or in combination with the ARC comprises a hard mask when patterned, as further discussed below.

Then, a layer of photosensitive material is applied to the intermediate structure. The layer of photosensitive material is patterned by lithographic means and developed and etched to form a lithographic image including lines and spaces (also referred to herein as a line and space pattern) having dimensions of the structures, e.g., wordline(s)/gate electrode (s), to be formed. In one embodiment, the lines and spaces include a minimum width dimension (critical dimension) dictated by the resolution limit of lithography. The resolution limit of the lithography is commonly understood to be the smallest dimension that is achievable by pushing the lithography system to its highest resolution limit.

Next, a hard mask is formed by transferring the lithographic image to the hard mask layer to produce a line and space pattern in the hard mask layer including the width dimensions of the structures, e.g., wordline(s)/gate electrode (s), to be formed. It is understood by those with ordinary skill in the art that in some cases the width dimension may be a critical dimension. Thereafter, to produce a wordline (s)/gate electrode(s) including the width dimension and/or pitch having a particular dimension, a conductive material is formed over the underlying layer portions exposed by the openings in the hard mask and the horizontal surface of the hard mask to form a conductive layer. A thickness of the conductive material is greater than a thickness of the hard mask.

By etching using a chemical mechanical polishing (CMP), for example, the conductive layer is removed from all the horizontal surfaces of the hard mask. Thus, a wordline (s)/gate electrode(s) of the conductive material is left in the corresponding opening(s) in the hard mask. Next, as an option, the hard mask may be removed by a reactive ion etch (RIE) to expose the underlying dielectric layer. Following the removal of the hard mask, the semiconductor device may be completed using conventional techniques as is understood by those having ordinary skill in the art.

Figure 1:
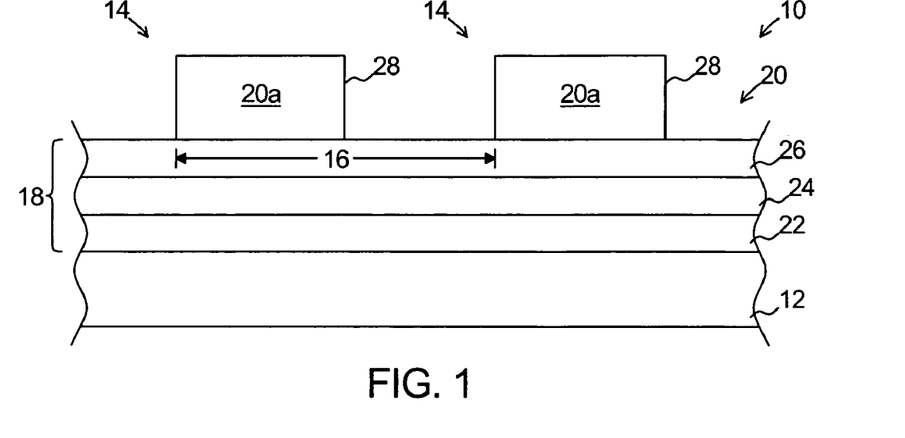
FIG. 1 is a cross-sectional view of a semiconductor device that includes a wordline formed using a damascene processes in accordance with one embodiment of the present invention.

Referring initially to FIG. 1, a structure illustrative of the present invention is shown, generally designated as 10. Further, the structure 10 will be described below in relationship to a semiconductor device. Although the structure 10 may also be referred to as a semiconductor device 10, those having ordinary skill in the art will appreciate that the invention applies to the formation of features over a substrate including a precise width dimension or critical dimension (CD).

The semiconductor device 10 comprises a semiconductor substrate 12 having a gate pattern including a gate stack 14 (two gate stacks are illustrated in FIG. 1). In one embodiment, the semiconductor device 10 includes a gate pattern including a pitch 16. In one embodiment, the pitch 16 is the smallest pitch achievable at the resolution limit of lithography.

Each gate stack 14 includes a dielectric layer 18 interposed between a gate electrode 20a formed from a conductive layer 20, as further described below. That is, a damascene process is used to form the individual gate electrodes 20a from the conductive layer 20.

As illustrated in FIG. 1, the dielectric layer 18 may comprise multiple layers. The multiple layers of the dielectric layer 18 may include a tunneling layer 22, a charge-trapping layer 24 and an insulating layer 26. The tunneling layer 22 is interposed between the charge-trapping layer 24 and the semiconductor substrate 12. The charge-trapping layer 24 is interposed between the insulating layer 26 and the tunneling layer 22. Over the insulating layer 26, the gate electrodes 20a are formed from the conductive layer 20.

The resulting semiconductor device 10 has a gate pattern including the pitch 16. Further, the gate electrodes 20a have vertical sidewalls 28 that include relatively smooth surfaces. In one embodiment, the gate electrodes 20a have a width dimension, i.e., a critical dimension, that is the smallest width dimension achievable by lithography processes alone.

Thus, a semiconductor device 10 is formed including a gate pattern including at least one gate electrode 20a per pitch 16 of a gate pattern. Further, the method of manufacturing the semiconductor device 10 significantly increases the yield of gate stacks 14 on the semiconductor substrate 12. Further, the method forms the semiconductor device 10 including gate electrodes 20a comprising precise widths and/or pitch. Further still, the process overcomes the limitation of photoresist in forming gate electrodes 20a including a critical dimension. For example, conventional photoresists are not capable of being used as a photoresist mask when CMP is used as described above. That is, CMP would degrade a photoresist mask, e.g., smear, to the extent the photoresist mask could no longer perform as a mask to form precise gate electrodes. Additionally, gate electrodes 20a formed including smooth surfaces allow for further semiconductor device scaling. Thus, gate stacks 14 including faster operating speeds may be achieved. Also, the method extends the use of current lithography apparatuses.

Figure 6:
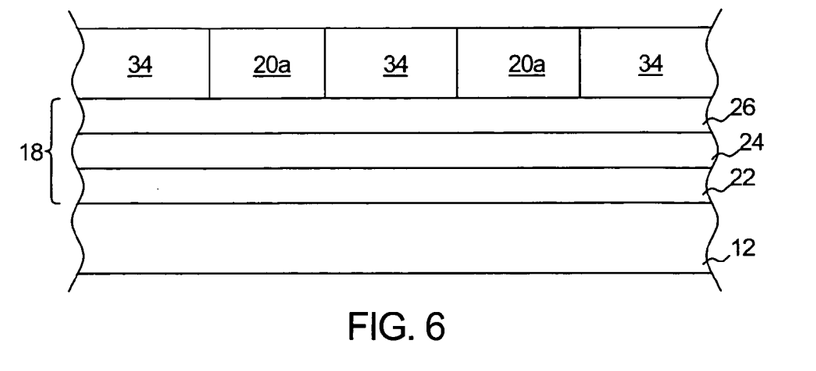
Figure 7:
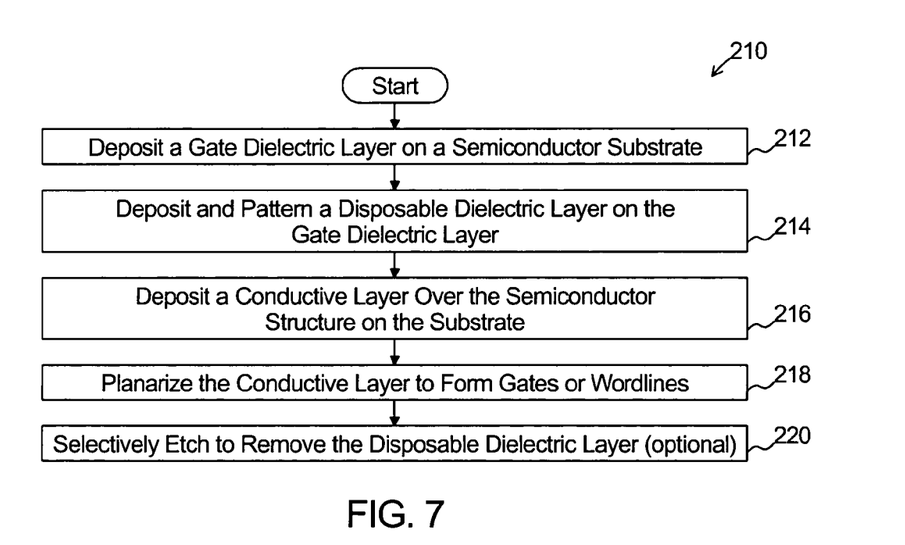
FIG. 7 is a flow chart highlighting steps of the manufacturing process.

The steps of a method 210 for fabricating a semiconductor device 10 are outlined in the flow chart shown in FIG. 7. FIGS. 2–6 illustrate various steps of the method 210. It will be appreciated that the method 210 and the semiconductor device 10 described below are merely exemplary and, that suitable embodiments of the many below described variations in materials, thicknesses, and/or structures may alternatively be used in the method 210 and/or the semiconductor device 10.

Figure 2:
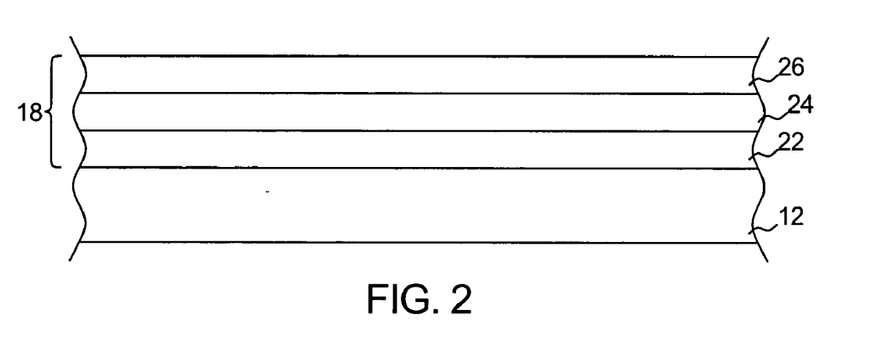
FIGS. 2–6 are cross-sectional views of the device of FIG. 1 at intermediate stages of manufacture.

In Step 212, as represented in FIG. 2, a structure representing an intermediate step of the manufacturing process is shown. The method is initiated with the substrate 12. The substrate 12 may be of any material over which the dielectric layer 18 may be formed, as further described below.

For illustrative purposes, the substrate 12 is a bulk semiconductor substrate of silicon. The semiconductor substrate 12 includes an active region (not shown) extending from a surface of the semiconductor substrate 12 to a depth of about 3 nm.

Next, the dielectric layer 18 is formed over the semiconductor substrate 12. The dielectric layer 18 may be a single dielectric layer or a multi-layer dielectric layer. In one embodiment, the dielectric layer 18 may be a charge trapping dielectric layer comprising a tunneling layer 22, a charge trapping layer 24 and an insulating layer 26. However, it should be understood by those having ordinary skill in the art that the charge trapping dielectric layer may comprise only two layers, e.g., the tunneling layer 22 and the charge trapping layer 24, as further described below.

For illustrative purposes, the dielectric layer 18 is a charge trapping dielectric layer formed over the semiconductor substrate 12. The charge trapping dielectric layer includes the tunneling layer 22, the charge trapping layer 24 and the insulating layer 26. The tunneling layer 22 and the insulating layer 26 are of silicon dioxide. The charge trapping layer 24 is of silicon nitride. The tunneling layer, the insulating layer 26 and the charge trapping layer each have a thickness of about 5 nm.

Although the term non-volatile memory device is often used herein, it is to be understood that a non-volatile memory device as used herein may contain any of the charge trapping dielectrics described herein. In other words, a non-volatile memory device contains any dielectric layer or layers that are capable of or facilitate electron trapping, and the non-volatile memory device contains an ONO charge trapping dielectric only when a specific reference to such dielectric is indicated.

Figure 3:
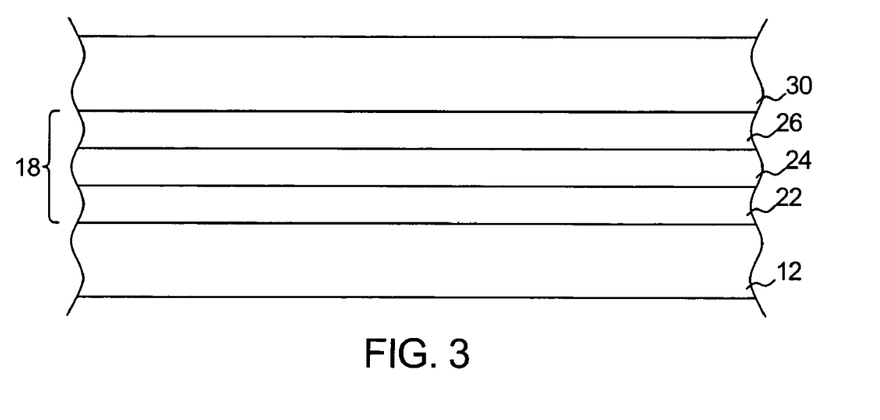

Now referring to FIG. 3, in Step 214, a liner layer (optional) (not shown) is formed over the dielectric layer 18. The liner layer functions as an etch stop layer. Accordingly, the liner layer may be of any material over which the hard mask layer 30 may be formed and which can be used to stop an etch process of the hard mask layer 30.

For illustrative purposes, the liner layer is of silicon nitride. The liner layer has a thickness of about 2.5 nm. The liner layer is deposited by CVD.

Next, the hard mask layer 30 to be patterned is formed over the dielectric layer 18 (over the liner layer, if the liner layer is formed); again using conventional techniques. For example, the hard mask layer 30 may be thermally grown. Alternatively, the hard mask layer 30 may be deposited using conventional techniques. Further, the hard mask layer 30 may be formed using a combination of the above, e.g., a thin oxide layer may be thermally grown to form a good interface and then an oxide of lesser quality may be deposited thereon.

The hard mask layer 30 may be of any known mask material, as further described below, over which a photosensitive imaging layer can be coated and patterned by conventional lithographic techniques. For illustrative purposes, the hard mask layer 30 is HTO. The hard mask layer 30 has a thickness of about 30 nm. The hard mask layer 30 is deposited by CVD.

Next, an anti-reflective coating (ARC) (optional) (not shown) of silicon rich nitride (SiRN) is formed over the hard mask layer 30. Other exemplary materials which may be used as the ARC include a SiON, a silicon rich oxide (SiRO), a disposable organic ARC or the like. The ARC is deposited by CVD, for example. The ARC is used when increased resolution of the lithography process is required.

Next, an imaging layer (not shown) of a photosensitive material is applied, for example, by spin-coating. The imaging layer may have a thickness in the range of about 30 nm to about 500 nm, for example. Then, the imaging layer is patterned by pattern-exposing using a conventional lithographic tool, developed, rinsed and dried. Next, an anisotropic etching is conducted to form a line and space pattern in the imaging layer according to the pattern (not shown).

The lines in the photosensitive material have sidewalls, including a vertical component. By controlling the dimension of the lines with precision in the lithographic image, the spaces of the lithographic pattern will be formed with precision and it is the precise dimension of spaces which is sought. The width dimension of the lines is determined by the characteristics of the device being formed. In one embodiment, the width dimension of the lines is the smallest image dimension that is obtainable by the conventional lithography process utilized above. As mentioned above, the width may be the smallest dimension that is achievable by pushing lithography system to its highest resolution limit. Next, the imaging layer may be subjected to a hardening process to thermally stabilize the imaging layer. Deep ultraviolet exposure or heat treatment at a temperature of about 200° C. to about 250° C. for about 1–2 minutes may be used for hardening. Another method of hardening the imaging layer is by subjecting it to a halogen gas plasma. This hardening step is optional and may be needed for conventional photoresists, lest the photosensitive material constituting the imaging layer may melt and flow or otherwise get degraded during the subsequent process.

Figure 4:
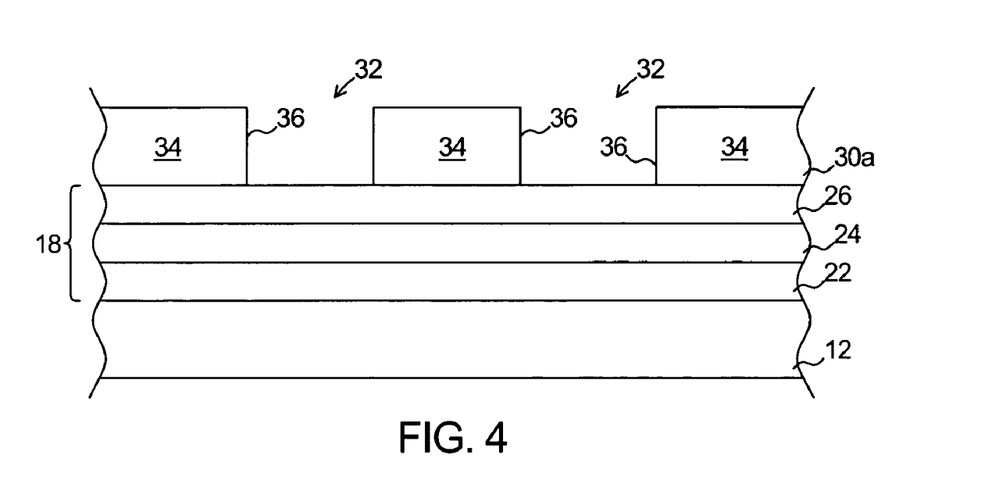

Referring now to FIG. 4, next, an anisotropic etching is conducted to transfer the lithographic image (the pattern in the photoresist) from the imaging layer to the ARC, if used, and the hard mask layer 30. A patterned hard mask layer (generally designated 30a), alone or in combination with the patterned ARC (not shown), may be generally referred to as the "hard mask". The etchant removes the exposed ARC and the underlying hard mask layer 30 in the openings (apertures) of the photosensitive material leaving a line 34 and a space 32 (also opening 32) in the hard mask 30a, including a dimension substantially similar to the dimension of a line and the space in the photosensitive material. The lines 34 have sidewalls 36, including a vertical component. A subsequent anisotropic etching removes any remaining imaging layer (not shown). Thus, the lithographic image is transferred from the patterned imaging layer to the hard mask 30a.

Figure 5:
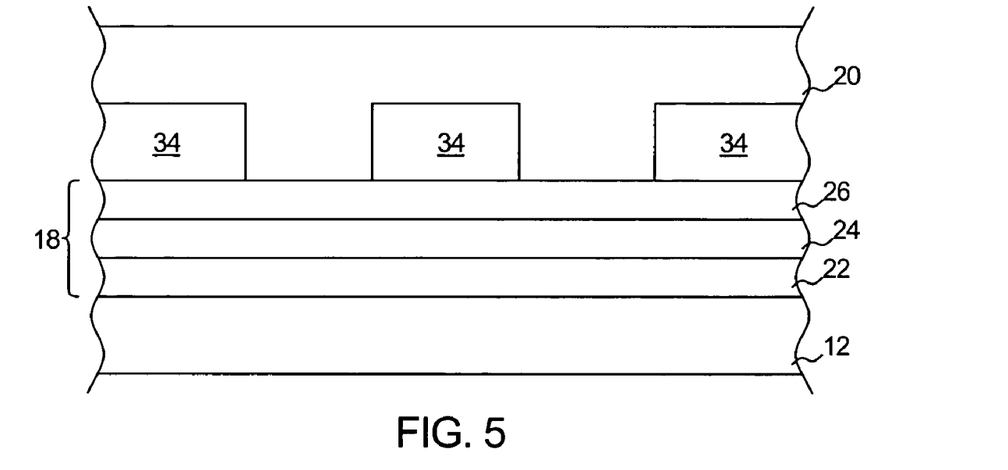

Next in Step 216 and Step 218, as illustrated in FIGS. 5–6, gate electrodes 20a are formed in the openings 32 of the patterned hard mask layer 30a (FIG. 6). As represented in FIG. 5, according to one method, a conductive layer 20 is formed over the patterned hard mask layer 30a and the portion of the dielectric layer 18 (or over the liner layer, if used) exposed by the openings 32 therein.

In general, the conductive layer 20 may be any material, as further described below, that can be deposited over the patterned hard mask layer 30a. For exemplary purposes, the conductive layer 20 is of a polysilicon. The polysilicon may be deposited over the substrate 12 using a PECVD process.

The lower limit and the upper limit of the thickness of the conductive layer 20 is dictated by the requirements of good step coverage associated with the vertical wall profile of a line 34 of the hard mask 30a and viability of the conductive layer 20 as a thin film useful as a wordline(s)/gate electrode(s).

Next, as shown in FIG. 6, the conductive layer 20 is etched using, for example, a CMP to remove the conductive layer 20 from all the horizontal surfaces of the hard mask 30a. Thus, unetched portions of the conductive layer 20 are left in the openings 32 of the hard mask 30a. These unetched portions of the conductive layer 20 form wordline(s)/gate electrodes 20a.

Accordingly, the dimensions of the wordline(s)/gate electrodes 20a are approximately equal to the dimensions of the openings 32. Thus, the gate electrodes 20a include a precise width dimension. In one embodiment, the width dimension is achievable at a resolution limit of lithography.

Now referring back to FIG. 1, in Step 220, the hard mask 30a may optionally be removed from the semiconductor substrate 12. Subjecting the hard mask 30a to a suitable etchant, for example, a hot oxidizing acid such as nitric acid, sulphuric acid, hot phosphoric acid or a hot phenol removes the hard mask 30a. Alternatively, the hard mask 30a may be removed by oxygen plasma. Any of the hard mask 30a that remains may be removed by mechanical means, a plasma etch or washed off in a liquid base. It should be understood by those having ordinary skill in the art, the hard mask 30a is removed i.e., etched, with an etchant with a selectivity such that the gate dielectric will not be damaged by the etchant. For example, an etchant could be selected to stop on a nitride layer.

However, the etchant species must have a selectivity between the hard mask 30a and the gate electrodes 20a, as described above. The exposed liner layer, if formed, may be removed by an RIE, if desired. Alternatively, the etchant used may be an $O_2$ plasma, an argon plasma, a fluorine plasma or the like.

Next, the semiconductor device 10 may be completed using conventional techniques known by those having ordinary skill in the art (not shown). For example, if the sidewalls of the non-volatile memory device are exposed, a spacer may be formed on a sidewall of the non-volatile memory cell. The spacer may be of an insulating film in consideration of the diffusion of the impurities in the lateral direction during the formation of the source and drain regions. Additionally, the semiconductor device 10, may be further isolated from other devices on the semiconductor substrate by a LOCal Oxidation of Silicon (LOCOS) oxide film or a trench device isolation film (shallow trench isolation, i.e., STI). Further, contacts may be formed to the non-volatile memory cell and the source and drain regions, or the like, to complete a working semiconductor device 10.

As mentioned above, the substrate 12 may be of any material over which the dielectric layer 18 may be formed, for example, a conductive material, a non-conductive material, a semiconductive material or a combination thereof. A substrate of a semiconductive material (referred to herein as a semiconductor substrate) may be a bulk substrate, a composite semiconductor substrate or the like. Further, the semiconductor substrate may be formed of silicon, germanium or the like; a compound semiconductor, such as, GaAs, InGaAs or the like.

The composite semiconductor substrate may be a semiconductor-on-insulator (SOI), a silicon-on-insulator, a germanium-on-insulator (GOI) or the like. The composite semiconductor substrate may comprise a support substrate, an insulating layer formed over the support substrate and a surface semiconductor layer formed over the insulating layer. The support substrate may be of one of the materials described above.

The insulating layer may comprise sapphire, quartz, glass, plastic or the like. For example, the insulating layer may be silicon oxide ($Si_xO_y$). The insulating layer may be a nitride layer, for example, silicon oxynitride (SiON), silicon nitride (SiN) or the like. Alternatively, the insulating layer may also be an undoped polysilicon. Further, the insulating layer may be of a material, including a permittivity greater than a permittivity of silicon dioxide ($SiO_2$), i.e., about 3.9.

Permittivity, $\epsilon$, of a material reflects the ability of the material to be polarized by an electric field. The permittivity of a material is typically described as its permittivity normalized to the permittivity of a vacuum, $\epsilon_o$. Hence, the relative permittivity, referred to as a dielectric constant K, of a material is defined as:

$$K=\epsilon/\epsilon_o.$$

While silicon dioxide ($SiO_2$) (sometimes simply referred to as "oxide") has a dielectric constant of approximately 3.9, other materials have higher K values. For example, aluminum oxide ($Al_2O_3$) has a K of about 9 to about 10. Much higher K values of, for example, 20 or more, can be obtained with various transition metal oxides, including tantalum oxide ($Ta_2O_5$), hafnium oxide ($HfO_2$) and zirconium oxide ($ZrO_2$).

Using a dielectric material including a higher K, for example, for the gate dielectric, allows a high capacitance and an electrical equivalent thickness of a thinner silicon dioxide ($SiO_2$) gate dielectric layer to be achieved while maintaining or increasing the physical thickness of the gate dielectric. For example, an aluminum oxide ($Al_2O_3$) layer that includes a K of 9.6 and a physical thickness of 6.25 nm is substantially electrically equivalent to a silicon oxide ($SiO_2$) layer (K=3.9), including a physical thickness of 2.5 nm. Therefore, the gate dielectric can be made electrically thin while being formed of a physically thicker layer compared to a conventional $SiO_2$ gate dielectric layer.

Examples of dielectric materials having a high-K include the following: aluminum oxide ($Al_2O_3$), hafnium oxide ($HfO_2$), zirconium oxide ($Zr_xO_y$), titanium oxide (TiO), yttrium oxide (YO), zirconium silicate, hafnium silicate, lanthanum oxide ($La_2O_3$), cerium oxide ($CeO_2$), bismuth silicon oxide ($Bi_4Si_2O_{12}$), tantalum oxide ($Ta_2O_5$), tungsten oxide ($WO_3$), $LaAlO_3$, BST ($Ba_{1-x}Sr_xTiO_3$), $PbTiO_3$, $BaTiO_3$, $SiTiO_3$, $PbZrO_3$, PST ($PbSc_xTa_{1-x}O_3$), PZN ($PbZn_xNb_{1-x}O_3$), PZT ($PbZr_xTi_{1-x}O_3$), PMN ($PbMg_xNb_{1-x}O_3$) or the like. Additionally, the insulating layer may comprise other binary and tertiary metal oxides and ferro electric material, including a dielectric constant greater than silicon dioxide ($SiO_2$).

The thickness of the insulating layer may be adjusted in consideration of the characteristics of a semiconductor device to be realized, the magnitude of the voltage to be applied when the realized semiconductor is used, and is, for example, about 10 nm to about 100 nm thick.

The surface semiconductor layer functions as an active layer for forming the semiconductor device 10. The surface semiconductor layer may be made of a semiconductor material, such as silicon, germanium or the like; or a compound semiconductor, such as germanium-silicon (GeSi), GaAs, InGaAs or the like, or mixtures thereof. The surface semiconductor layer may be in a single crystal, polycrystalline or nanocrystalline form.

The thickness of the surface semiconductor layer can be adjusted in consideration of the characteristics of the semiconductor device 10 to be realized. For example, the junction depth of the source and drain regions may be varied. The depth of the channel region within the surface semiconductor layer may also be varied. The surface semiconductor layer may be, for example, about 1 nm to about 100 nm thick.

With regards to the dielectric layer 18, the dielectric layer 18 may be of any material or combination of materials over which a hard mask layer 30 may be formed. In one embodiment, the dielectric layer 18 may be formed of any dielectric material, for example, oxide material, such as, $SiO_2$ or $Si_xO_y$, or of a high-K dielectric material, as further described above.

In the embodiment where the dielectric layer 18 is a charge trapping dielectric layer (three sub-layers), the tunneling layer 22 is interposed between the charge trapping layer 24 and the semiconductor substrate 12. The charge trapping layer 24 is interposed between the insulating layer 26a and the tunneling layer 22. The insulating layer 26a is formed over the charge trapping layer 24.

The tunneling layer 22 and the insulating layer 26a may be of any dielectric material, e.g., $Si_xO_y$, or of a high-K dielectric material, as further described above. For example, one or both of the tunneling layer 22 and the insulating layer 26a may be silicon oxide ($Si_xO_y$). One or both of the tunneling layer 22 and the insulating layer 26a may be an undoped polysilicon. One or both of the tunneling layer 22 and the insulating layer 26a may be a silicon-rich silicon dioxide layer. One or both of the tunneling layer 22 and the insulating layer 26a may be a layer having a high permittivity. One or both of the tunneling layer 22 and the insulating layer 26a may be an oxygen-rich silicon dioxide layer. One or both of the tunneling layer 22 and the insulating layer 26a may be a nitrided oxide layer. It should be understood by those having ordinary skill in the art that one or more of the sub-layers of the dielectric layer 18 may be of the same material, for example, SiRN, with different compositions. One or both of the tunneling layer 22 and the insulating layer 26a may be a thermally grown oxide or a deposited oxide.

The charge trapping layer 24 may be of any material that is compatible with the first and second dielectric layers and is capable of storing a charge. The charge trapping layer 24 may be a nitride, e.g., silicon nitride (SiN), silicon oxynitride (SiON), silicon rich nitride (SiRN) or the like. The charge trapping layer 24 may also be a nitrogen-rich silicon nitride layer.

In one embodiment, the three sub-layers 22, 24 and 26a form an oxide-nitride-oxide dielectric layer, commonly referred to as an ONO layer or an ONO dielectric layer. When the dielectric layer 18 acts as a charge trapping dielectric, the electron trapping is performed in the charge trapping layer 24. In this case, the dielectric layer 18 may be any dielectric layer or layers that are capable of or facilitate electron trapping. For example, the charge trapping dielectrics include an ONO trilayer dielectric, an oxide/nitride bilayer dielectric, a nitride/oxide bilayer dielectric, an oxide/tantalum oxide bilayer dielectric ($SiO_2/Ta_2O_5$), an oxide/tantalum oxide/oxide trilayer dielectric ($SiO_2/Ta_2O_5/SiO_2$), an oxide/strontium titanate bilayer dielectric ($SiO_2/SrTiO_3$), an oxide/barium strontium titanate bilayer dielectric ($SiO_2/BaSrTiO_2$), an oxide/strontium titanate/oxide trilayer dielectric ($SiO_2/SrTiO_3SiO_2$), an oxide/strontium titanate/barium strontium titanate trilayer dielectric ($SiO_2SrTiO_3BaSrTiO_2$), an oxide/hafnium oxide/oxide trilayer dielectric or the like (in each case, the first layer mentioned is the bottom layer while the last layer mentioned is the top layer).

The dielectric layer 18 may have an overall thickness of between, for example, about less than 1 nm and about 500 nm. In one embodiment, the dielectric layer 18 may have a thickness of, for example, between about 10 nm and about 300 nm. In another embodiment, the dielectric layer 18 may have a thickness of, for example, between about 50 nm and about 250 nm. It should be understood by those having ordinary skill in the art that the above thickness ranges are merely exemplary and that the exemplary thicknesses ranges may be recombined, for example, from about 1 nm to about 300 nm, or about 10 nm to about 250 nm, or about 1 nm to about 10 nm or the like. Each sub-layer will be deposited to a thickness according to a desired device parameter for a semiconductor device 110 to be realized as further described below.

With regards to the overall thicknesses of the dielectric layer 18 described above, in one embodiment the tunneling layer 22 and the insulating layer 26a individually have thicknesses from about 0.5 nm to about 15 nm while the charge trapping layer 24 has a thickness from about 0.5 nm to about 15 nm. In another embodiment, the tunneling layer 22 and the insulating layer 26a individually have thicknesses from about 5 nm to about 12 nm while the charge trapping layer 24 has a thickness from about 3 nm to about 8 nm. In yet another embodiment, the tunneling layer 22 and the insulating layer 26a individually have thicknesses from about 7 nm to about 10 nm while the charge trapping layer 24 has a thickness of from about 3 nm to about 7 nm. In another embodiment, the tunneling layer 22 may have a thickness different than the insulating layer 26a.

Turning now to the liner layer, the liner layer may be a high temperature oxide (HTO), for example, silicon oxide ($Si_xO_y$). Additionally, the liner layer may be a nitride layer, for example, silicon oxynitride (SiON), silicon nitride (SiN) or the like.

The liner layer may be thermally grown. Alternatively, the liner layer may be deposited using conventional techniques. The liner layer may have a thickness of, for example, between about 1 nm to about 10 nm.

Referring now to the hard mask layer 30, the hard mask layer 30 may be a high temperature oxide (HTO), for example, silicon oxide ($Si_xO_y$). Additionally, the hard mask layer 30 may be a nitride layer, for example, silicon oxynitride (SiON), silicon nitride (SiN) or the like. Alternatively, the hard mask layer 30 may be of a high-k material as described above.

The hard mask layer 30 may have a thickness of, for example, between about 50 nm to about 150 nm. In one embodiment, the hard mask layer 30 may have a thickness of, for example, between about 1 nm and about 300 nm. In another embodiment, the hard mask layer 30 may have a thickness of, for example, between about 5 nm and about 250 nm. It will be understood by those having ordinary skill in the art that the above thickness ranges of the hard mask layer 30 are merely exemplary and that the thickness ranges may be recombined, for example, from about 1 nm to about 150 nm, or about 50 nm to about 250 nm, or about 1 nm to about 5 nm or the like.

Now referring to the conductive layer 20, the conductive layer 20 can be formed of doped or undoped polysilicon, silicide of a metal including a high melting point such as W, Ta, Ti, Mo or the like; polycide made of the silicide (for example, $MoSi_2$, $WSi_2$) and polysilicon; and the other metals. Alternatively, the conductive layer 20 may be porous, amorphous, single crystal, polycrystalline, nanocrystalline or the like, or combinations thereof. The conductive layer 20 may be, for example, about 5 nm thick.

In one embodiment, the conductive layer 20 may have a thickness of, for example, between about 30 nm and about 1000 nm. In another embodiment, the conductive layer 20 may have a thickness of, for example, between about 50 nm and about 500 nm. It should be understood by those having ordinary skill in the art that the above thicknesses are merely exemplary and that the thicknesses may be combined, for example, from about 30 nm to about 500 nm, or about 50 nm to about 1000 nm, or about 30 nm to about 50 nm or the like.

The conductive layer 20 is applied over the substrate 12 or the dielectric layer 18 using known techniques such as spin-coating, chemical vapor deposition (CVD), plasma enhanced chemical vapor deposition (PECVD), atomic layer deposition (ALD) or the like.

Figure 8:
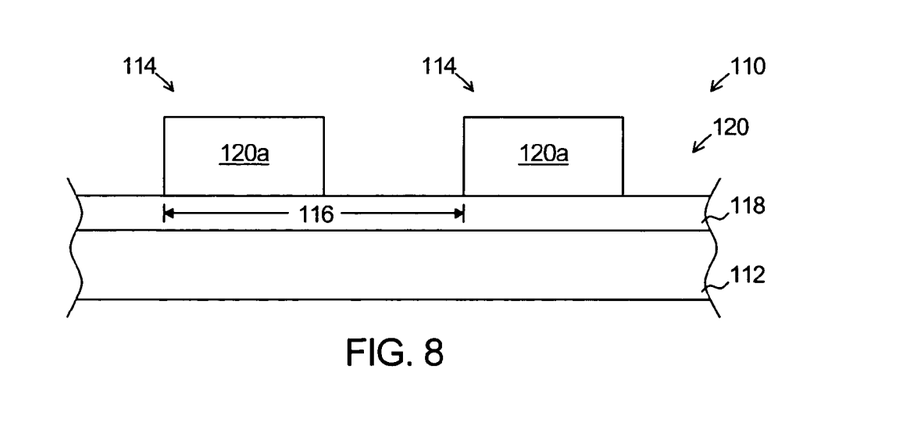
FIG. 8 is a cross-sectional view of a semiconductor device that includes a wordline formed using a damascene processes in accordance with another embodiment of the present invention.

With reference to FIG. 8, another embodiment is illustrated and the semiconductor device is generally designated 110. The semiconductor device 110 includes a semiconductor substrate 112 including gate stacks 114 and a pitch 116. The semiconductor device 110 also includes a dielectric layer 118 formed over the semiconductor substrate 112. The dielectric layer 118 functions as a gate dielectric. A conductive layer 120 including wordline(s)/gate electrodes 120a is formed over the dielectric layer 118. The wordline(s)/gate electrodes 120a include dimensions of an image formed in a hard mask by a damascene process. Additionally, the wordline(s)/gate electrodes 120a include vertical sidewalls having relatively smooth surfaces. In one embodiment, the semiconductor device 110 includes isolation structures (not shown) interposed between the individual cells to electrically isolate the individual cells.

Another example of a device which may take advantage of a gate electrode including a precise width dimension and the vertical sidewalls having relatively smooth sidewalls, is a FLASH memory cell. In particular, the formation of a floating gate and/or the control gate for such a device. Such a FLASH memory cell would be capable of operating at significantly higher speeds than traditional FLASH memory cell devices formed by conventional techniques. Additionally, the scaling of the FLASH memory cell would allow a higher yield per wafer.

While the invention has been explained in relation to its preferred embodiments, it is to be understood that various modifications will become apparent to those skilled in the art upon reading the specification. It will further be appreciated that the semiconductor device 10 and 110 may alternatively have other shapes than the shapes shown in FIGS. 1 and 8, for example. Therefore, it is to be understood that the invention disclosed herein is intended to cover such modifications as fall within the scope of the appended claims. Additionally, although the flow chart 210 of FIG. 7 shows a specific procedural order, it is understood that the procedural order may differ from that which is depicted. For example, the procedural order of two or more blocks may be reordered relative to the order shown. Also, two or more blocks shown in succession in FIG. 7 may be executed concurrently or with partial concurrence.

INDUSTRIAL APPLICABILITY

A semiconductor device fabricated using this damascene process includes a wordline(s)/gate electrode(s) having a precise dimension. Additionally, the wordline(s)/gate electrode(s) includes sidewalls with a vertical component having relatively smooth surfaces. In one embodiment, a semiconductor device includes a pitch having a critical dimension obtainable by conventional lithography processes alone. In one embodiment, a semiconductor device includes a wordline(s)/gate electrode(s) having a width dimension, i.e., a critical dimension, obtainable by conventional lithography processes alone. Such semiconductor devices would be capable of operating at significantly higher speeds than traditional semiconductor devices formed by conventional techniques. Additionally, the scaling of the semiconductor devices would allow a higher yield per wafer.

What is claimed is:

1. A method of forming a semiconductor device, the method comprising the steps of:
    forming a charge-trapping dielectric layer over a substrate, the charge-trapping dielectric layer including a tunnelling layer, a charge-trapping layer, and an insulating layer, wherein the tunnelling layer is disposed over the substrate, the charge-trapping layer is disposed over the tunnelling layer and the insulating layer is disposed over the charge-trapping layer;
    forming a mask layer over the dielectric layer;
    forming a photosensitive layer over the mask layer;
    using the photosensitive layer to pattern only the mask layer to form a mask including a mask line and space pattern, the mask line and space pattern including at least one mask space; and
    forming a conductive layer over the patterned mask layer and filling the at least one mask space, the conductive layer including a width dimension about equal to the width dimension of the least one mask space; and
    planarizing the conductive layer down to horizontal surfaces of the mask.

2. The method according to claim 1, further comprising the steps of:
    removing the mask to expose sidewalls of the conductive layer, wherein the sidewalls include relatively smooth surfaces.

3. The method according to claim 2, wherein the step of forming the conductive layer comprises the steps of:
    forming a conformal layer of a conductive material over the mask and exposed surface of the dielectric layer; and
    anisotropically etching to remove a portion of the conductive material from horizontal surfaces of the mask.

4. The method according to claim 1, wherein the mask layer comprises at least one of photoresist; silicon oxide ($Si_xO_y$), silicon-dioxide ($SiO_2$), aluminum oxide ($Al_2O_3$), hafnium oxide (HfO), zirconium oxide (ZrO), titanium oxide (TiO), yttrium oxide (YO), lanthanum oxide ($La_2O_3$), cerium oxide ($CeO_2$), bismuth silicon oxide ($Bi_4Si_2O_{12}$), tantalum oxide ($Ta_2O_5$), tungsten oxide ($WO_3$), $LaAlO_3$, BST ($Ba_{1-x}Sr_xTiO_3$), $PbTiO_3$, $BaTiO_3$, $SiTiO_3$, $PbZrO_3$, PST ($PbSc_xTa_{1-x}O_3$), PZN ($PbZn_xNb_{1-x}O_3$), PZT ($PbZr_xTi_{1-x}O_3$), PMN ($PbMg_xNb_{1-x}O_3$), binary and tertiary metal oxides, other metal oxides; silicon nitride ($Si_xN_y$), silicon oxynitride ($SiO_xN_y$), other nitrides; zirconium silicate, hafnium silicate, other silicates; ferro electric material; the aforementioned materials implanted with any element; the aforementioned materials in layered or graded composition combinations; the aforementioned materials in porous, amorphous, single crystal, polycrystalline, or nanocrystalline form; and mixtures thereof.

5. The method according to claim 1, further comprising the step of:
    forming and patterning an anti-reflective coating (ARC) over the mask layer.

6. The method according to claim 5, wherein the mask comprises the patterned ARC and the patterned mask layer.

7. The method according to claim 1, wherein the germanium (Ge) comprises crystalline germanium.

8. The method according to claim 1, wherein the dielectric layer comprises at least one of silicon oxide ($Si_xO_y$), silicon-dioxide ($SiO_2$), aluminum oxide ($Al_2O_3$), hafnium oxide (HfO), zirconium oxide (ZrO), titanium oxide (TiO), yttrium oxide (YO), lanthanum oxide ($La_2O_3$), cerium oxide ($CeO_2$), bismuth silicon oxide ($Bi_4Si_2O_{12}$), tantalum oxide ($Ta_2O_5$), tungsten oxide ($WO_3$), $LaAlO_3$, BST ($Ba_{1-x}Sr_xTiO_3$), $PbTiO_3$, $BaTiO_3$, $SiTiO_3$, $PbZrO_3$, PST ($PbSc_xTa_{1-x}O_3$), PZN ($PbZn_xNb_{1-x}O_3$), PZT ($PbZr_xTi_{1-x}O_3$), PMN ($PbMg_xNb_{1-x}O_3$), binary and tertiary metal oxides, other metal oxides; silicon nitride ($Si_xN_y$), silicon oxynitride ($SiO_xN_y$), other nitrides; zirconium silicate, hafnium silicate, other silicates; ferro electric material; the aforementioned materials implanted with any element; the aforementioned materials in layered or graded composition combinations; the aforementioned materials in porous, amorphous, single crystal, polycrystalline, or nanocrystalline form; and mixtures thereof.

9. The method according to claim 1, wherein the mask defines a pitch of the mask line and space pattern.

10. The method according to claim 1, wherein the substrate comprises:
    a germanium-on-insulator (GOI) structure including:
        a semiconductor substrate;
        an insulating layer disposed over the semiconductor substrate; and
        a semiconductive layer comprising germanium (Ge) disposed over the insulating layer.

11. A method of forming a semiconductor device, the method comprising the steps of:
    forming a charge-trapping dielectric layer over a substrate, the charge-trapping dielectric layer including a tunnelling layer, a charge-trapping layer, and an insulating layer, wherein the tunnelling layer is disposed over the substrate, the charge-trapping layer is disposed over the tunnelling layer and the insulating layer is disposed over the charge-trapping layer;

forming a mask over the charge-trapping dielectric layer to include a line and space pattern, the line and space pattern having at least one space including a width dimension; and forming a conductive layer over the mask layer and filling the at least one space of the mask, the conductive layer including a width dimension about equal to the width dimension of the at least one space of the mask; and planarizing the conductive layer down to horizontal surfaces of the mask.

12. The method according to claim 11, wherein the substrate comprises:
  a germanium-on-insulator (GOI) structure including:
    a semiconductor substrate;
    an insulating layer disposed over the semiconductor substrate; and
    a semiconductive layer comprising germanium (Ge) disposed over the insulating layer.

* * * * *

UNITED STATES PATENT AND TRADEMARK OFFICE
CERTIFICATE OF CORRECTION

PATENT NO. : 6,933,219 B1
DATED : August 23, 2005
INVENTOR(S) : Lingunis et al.

It is certified that error appears in the above-identified patent and that said Letters Patent is hereby corrected as shown below:

Column 11,
Line 26, replace "(SiO2/SrTiO3SiO2)" with -- (SiO2/SrTiO3/SiO2) --.
Line 27, replace "(SiO2SrTiO3BaSrTiO2)" with -- (SiO2/SrTiO3/BaSrTiO2) --.

Column 14,
Line 7, replace "TaZO5" with -- Ta2O5 --.

Signed and Sealed this

Twenty-fifth Day of October, 2005

JON W. DUDAS
*Director of the United States Patent and Trademark Office*